United States Patent
Aramaki et al.

(10) Patent No.: US 12,395,595 B2
(45) Date of Patent: Aug. 19, 2025

(54) DEVICE HOUSING, IMAGE READING DEVICE, AND ELECTROSTATIC CAPACITANCE DETECTION DEVICE INCLUDING A GROUND AUXILIARY CONDUCTOR DISPOSED OVER A LEVEL DIFFERENCE EXISTING BETWEEN A PLANE INCLUDING AN ELECTRICALLY CONDUCTIVE SURFACE AND A PLANE INCLUDING A GROUND CONDUCTOR

(71) Applicant: Mitsubishi Electric Corporation, Tokyo (JP)

(72) Inventors: Toru Aramaki, Tokyo (JP); Hideki Matsui, Tokyo (JP); Hiroshi Koike, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 446 days.

(21) Appl. No.: 17/797,430

(22) PCT Filed: Feb. 5, 2021

(86) PCT No.: PCT/JP2021/004236
§ 371 (c)(1),
(2) Date: Aug. 4, 2022

(87) PCT Pub. No.: WO2021/157687
PCT Pub. Date: Aug. 12, 2021

(65) Prior Publication Data
US 2023/0062415 A1    Mar. 2, 2023

(30) Foreign Application Priority Data
Feb. 5, 2020   (JP) ................. 2020-017647

(51) Int. Cl.
*H04N 1/00* (2006.01)
*H01L 25/10* (2006.01)
*H10F 39/00* (2025.01)

(52) U.S. Cl.
CPC ....... *H04N 1/00976* (2013.01); *H01L 25/105* (2013.01); *H04N 1/00795* (2013.01); *H10F 39/804* (2025.01); *H01L 2225/06537* (2013.01)

(58) Field of Classification Search
CPC ................ H05K 3/301; H05K 9/0067; H05K 2201/10106; H05K 2201/10325;
(Continued)

(56) References Cited

U.S. PATENT DOCUMENTS 7,224,495 B2 * 5/2007 Yui .................... H04N 1/00989
358/497
8,476,532 B2 * 7/2013 Kitano ................ H05K 1/0215
361/752
(Continued)

FOREIGN PATENT DOCUMENTS

JP    59-89586 U    6/1984
JP    3-212995 A    9/1991
(Continued)

OTHER PUBLICATIONS

International Search Report and Written Opinion mailed on Apr. 20, 2021, received for PCT Application PCT/JP2021/004236, filed on Feb. 5, 2021, 11 pages including English Translation.

*Primary Examiner* — Vinh P Nguyen
(74) *Attorney, Agent, or Firm* — XSENSUS LLP

(57) ABSTRACT

Provided is a device housing made of materials containing at least an electrically conductive material, an image reading device, and an electrostatic capacitance detection device that can achieve electrical connection with a relatively small space while preventing deformation of the device housing. The device housing includes a housing made of materials
(Continued)

containing at least an electrically conductive material and including an electrically conductive surface in at least part of the surface of the housing, a ground conductor being present on a plane different from the plane including the electrically conductive surface, and a ground auxiliary conductor disposed over a level difference existing between the plane including the electrically conductive surface and the plane including the ground conductor. The ground auxiliary conductor is an electrically conductive sheet to connect the electrically conductive surface to the ground conductor electrically.

22 Claims, 20 Drawing Sheets

(58) Field of Classification Search
 CPC ........ G02B 6/4206; G02B 6/43; G02B 6/428; G02B 6/4214; H01S 2301/176; H01S 5/026; H01S 5/042; H01S 5/06258; H01S 5/0237; H04M 1/0277; H04M 1/0249; H04M 1/026; H10F 39/804; H04N 1/00557; H04N 1/00795; H04N 1/00976; H04N 1/0318; G01R 27/2605; G01R 27/26; G01R 31/2829; G01R 29/12; G01R 31/64; G01R 15/16; G01R 31/016; G01R 31/388; G01R 31/312; G01R 31/265; G06F 3/044; G06F 2203/04107; G06F 2203/04112

See application file for complete search history.

(56) References Cited

U.S. PATENT DOCUMENTS

| | | | |
|---|---|---|---|
| 8,643,798 B2* | 2/2014 | Onishi | G02F 1/136204 |
| | | | 349/40 |
| 9,237,248 B2* | 1/2016 | Osawa | G03G 21/1652 |
| 10,282,932 B2* | 5/2019 | Kagano | G07D 7/189 |
| 11,418,673 B2* | 8/2022 | Matsui | G02B 6/0006 |
| 2012/0092838 A1 | 4/2012 | Kitano et al. | |
| 2019/0139349 A1 | 5/2019 | Kagano et al. | |

FOREIGN PATENT DOCUMENTS

| | | |
|---|---|---|
| JP | 5-31932 A | 2/1993 |
| JP | 2010-214589 A | 9/2010 |
| JP | 2010-268131 A | 11/2010 |
| JP | 2011-114721 A | 6/2011 |
| JP | 2012-84800 A | 4/2012 |
| JP | 2016-63103 A | 4/2016 |
| WO | 2018/056443 A1 | 3/2018 |

* cited by examiner

A-A

DEVICE HOUSING, IMAGE READING DEVICE, AND ELECTROSTATIC CAPACITANCE DETECTION DEVICE INCLUDING A GROUND AUXILIARY CONDUCTOR DISPOSED OVER A LEVEL DIFFERENCE EXISTING BETWEEN A PLANE INCLUDING AN ELECTRICALLY CONDUCTIVE SURFACE AND A PLANE INCLUDING A GROUND CONDUCTOR

CROSS-REFERENCE TO RELATED APPLICATIONS

The present application is based on PCT filing PCT/JP2021/004236, filed Feb. 5, 2021, which claims priority to JP 2020-017647, filed Feb. 5, 2020, the entire contents of each are incorporated herein by reference.

TECHNICAL FIELD

The present disclosure relates to a device housing made of materials containing at least an electrically conductive material, and an image reading device and an electrostatic capacitance detection device including this device housing.

BACKGROUND ART

Some existing device housings each made of materials containing at least an electrically conductive material are fabricated by molding a resin mixed with an electrically conductive filler (for example, refer to Patent Literature 1). Some of these device housings fabricated by molding a resin are integrated with transparent plates, such as glass and resin plates (for example, refer to Patent Literatures 2 and 3). These device housings fabricated by integrating transparent plates and housings are applied to some image reading devices (image sensor units), like the device disclosed in Patent Literature 3.

Typical examples of the image reading devices (image sensor units) generate an image of a reading object, such as printed material, having a sheet shape. These devices are installed inside copiers, multifunction printers, facsimiles, scanners, and automatic teller machines (ATM), for example.

While typical image reading devices (image sensor units) generate an image, other image reading devices also have the functions of an electrostatic capacitance detection device to detect a variation in electrostatic capacity in a transported sheet-like reading object, such as printed material, and thereby facilitate detection of the thickness of the reading object and detection of a foreign object, such as cellophane tape, adhering to the reading object (for example, refer to Patent Literature 4). Patent Literature 4 also discloses an electrostatic capacitance detection device alone without an image reading device.

These image reading devices (image sensor units) and electrostatic capacitance detection devices each cause static electricity because a reading object is transported on a surface, such as the surface of a transparent plate. In order to discharge this static electricity to the outside, a device housing, designed to constitute the surfaces of the image sensor unit, is made of an electrically conductive resin containing an electrically conductive filler, and is connected to a ground structure electrically. This measure is commonly applied to device housings made of electrically conductive resins to deal with static electricity and other problems.

As measures for static electricity and other problems, various procedures for connecting electrically conductive device housings to ground structures electrically have been examined (for example, refer to Patent Literatures 5, 6, and 7). Patent Literature 5 discloses a procedure for connecting a connector terminal to a heat sink electrically by means of a fastener. Patent Literature 6 discloses a procedure for providing spikes to a metal component for achieving electrical connection and inserting the spikes to an electrically conductive resin by means of a fastener. Patent Literature 7 discloses a procedure for providing scratching claws to a metal component for achieving electrical connection and causing the scratching claws to form a linear scratch on the surface of an electrically conductive resin.

CITATION LIST

Patent Literature

Patent Literature 1: Unexamined Japanese Utility Model Application Publication No. S59-89586
Patent Literature 2: Unexamined Japanese Patent Application Publication No.
Patent Literature 3: Unexamined Japanese Patent Application Publication No. 2010-268131
Patent Literature 4: WO 2018/56443
Patent Literature 5: Unexamined Japanese Patent Application Publication No. H3-212995
Patent Literature 6: Unexamined Japanese Patent Application Publication No. H5-31932
Patent Literature 7: Unexamined Japanese Patent Application Publication No. 2016-63103

SUMMARY OF INVENTION

Technical Problem

Unfortunately, in these existing procedures for electrical connection, a device housing made of materials containing at least an electrically conductive material must include a rigid component and a dedicated structure to achieve electrical connection. Furthermore, the component made of an electrically conductive resin receives load and may lead to deformation of the device housings.

The present disclosure, which has been accomplished to solve the above problems, is related to a device housings made of materials containing at least an electrically conductive material that can achieve electrical connection with a relatively small space while preventing deformation of the device housing, and an image reading device and an electrostatic capacitance detection device including this device housing.

Solution to Problem

A device housing according to a first aspect of the present disclosure includes: a housing made of materials containing at least an electrically conductive material, the housing including an electrically conductive surface in at least part of a surface of the housing; a ground conductor being present on a plane different from a plane including the electrically conductive surface; and a ground auxiliary conductor disposed over a level difference existing between the plane including the electrically conductive surface and the plane including the ground conductor, the ground auxiliary conductor being an electrically conductive sheet to connect the electrically conductive surface to the ground conductor electrically.

An image reading device according to a second aspect of the present disclosure includes: a device housing; an optical component disposed in an installation space and configured to converge light incident through a dielectric plate; and a light receiver to receive the light converged by the optical component. The device housing includes: a housing made of materials containing at least an electrically conductive material, the housing including an electrically conductive surface in at least part of a surface of the housing; a ground conductor being present on a plane different from a plane including the electrically conductive surface; and a ground auxiliary conductor disposed over a level difference existing between the plane including the electrically conductive surface and the plane including the ground conductor, the ground auxiliary conductor being an electrically conductive sheet to connect the electrically conductive surface to the ground conductor electrically. The housing is a frame body supporting the dielectric plate. The device housing further includes a second housing. The second housing has a box shape having an opening. The housing is disposed to cover the opening. The housing and the second housing form the installation space therebetween. The housing and the second housing each have a rectangular shape extending in the longitudinal and transverse directions.

An electrostatic capacitance detection device according to a third aspect of the present disclosure includes: two device housings facing each other; a first electrode and a second electrode disposed in an installation space; an oscillator circuit to generate an electric field between the first electrode and the second electrode; a detection circuit to detect a variation in electrostatic capacity between the first electrode and the second electrode; and a first substrate and a second substrate provided with at least one of the oscillator circuit or the detection circuit. Two substrates of the respective device housings correspond to the first substrate and the second substrate. The device housing includes: a housing made of materials containing at least an electrically conductive material, the housing including an electrically conductive surface in at least part of a surface of the housing; a ground conductor being present on a plane different from a plane including the electrically conductive surface; and a ground auxiliary conductor disposed over a level difference existing between the plane including the electrically conductive surface and the plane including the ground conductor, the ground auxiliary conductor being an electrically conductive sheet to connect the electrically conductive surface to the ground conductor electrically. The housing is a frame body supporting a dielectric plate. The device housing further includes a second housing. The second housing has a box shape having an opening. The housing is disposed to cover the opening. The housing and the second housing form the installation space therebetween. The housing and the second housing each have a rectangular shape extending in the longitudinal and transverse directions. The ground conductor is an electrically conductive pattern provided on the substrate extending in the longitudinal direction.

Advantageous Effects of Invention

As described above, the present disclosure can provide a device housing less susceptible to deformation or size increase because of electrical connection between the housing and the ground conductor by means of the ground auxiliary conductor, which is an electrically conductive sheet, and provide an image reading device and an electrostatic capacitance detection device including this device housing.

DESCRIPTION OF EMBODIMENTS

Embodiment 1

Figure 1:
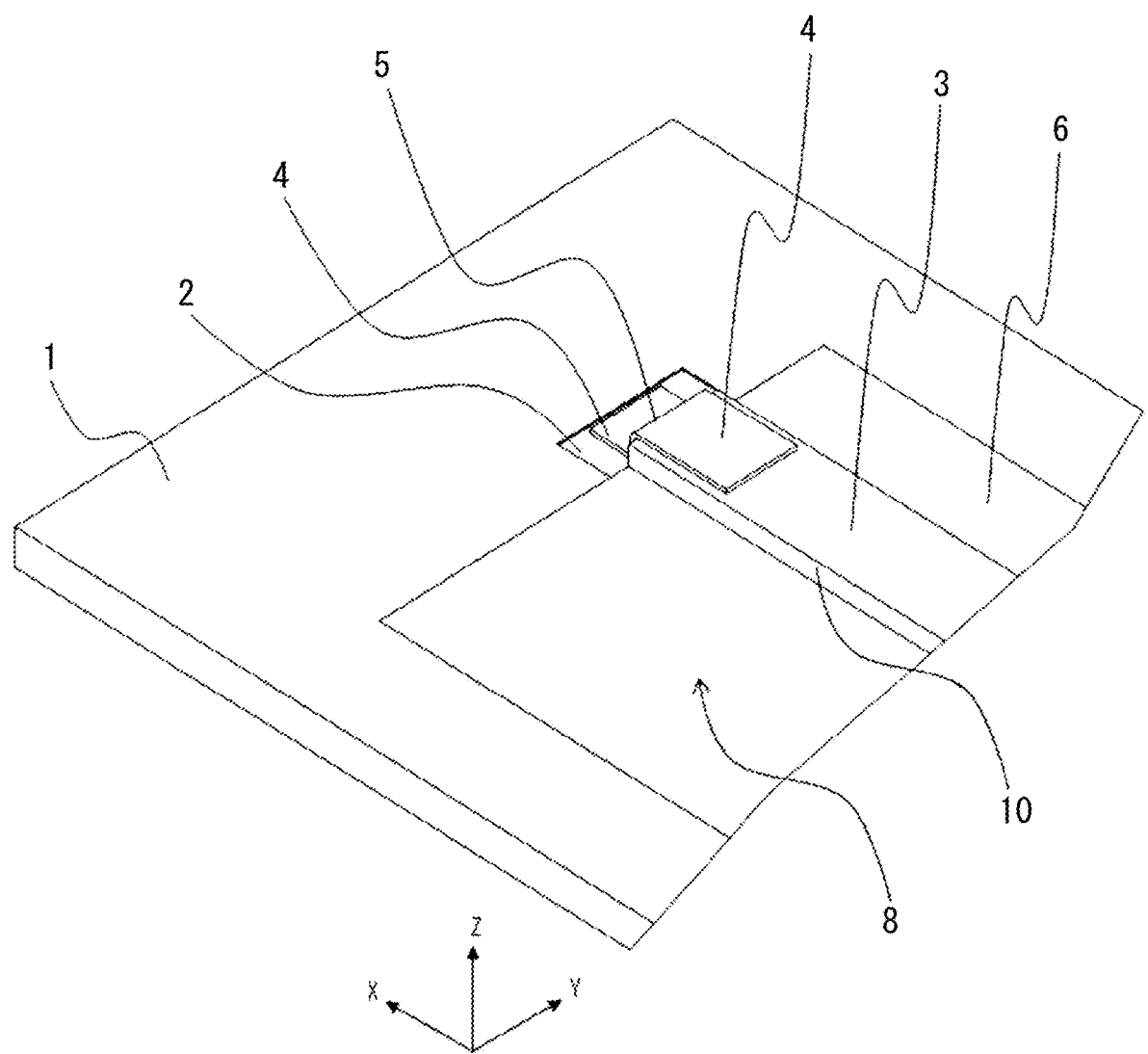
FIG. 1 is a partial perspective view of a device housing (frame body) according to Embodiment 1.

Embodiment 1 is described below with reference to FIGS. 1 to 14. FIGS. 1 to 7 illustrate a device housing according to Embodiment 1. An electrostatic capacitance detection device and an image reading device according to Embodiment 1 includes the device housing according to Embodiment 1. FIG. 8 illustrates the electrostatic capacitance detection device according to Embodiment 1. FIGS. 9 to 14 illustrate the image reading device according to Embodiment 1. The image reading device illustrated in FIGS. 13 and 14 includes the electrostatic capacitance detection device. Although the image reading device illustrated in FIGS. 9 to 12 includes some of the components of the electrostatic capacitance detection device, the scope of the present disclosure also encompasses the image reading device illustrated in FIGS. 9 to 12 that excludes the components of the electrostatic capacitance detection device except for the components necessary for the device housing. The identical or corresponding components are indicated by the same reference symbol in the drawings and are not redundantly described.

In FIGS. 1 to 11, the X-axis direction represents the longitudinal direction of the device housing according to Embodiment 1, the Y-axis direction represents the transverse direction, and the Z-axis direction represents the height direction. The drawings are directed to an example in which the X-axis, Y-axis, and Z-axis directions are orthogonal to each other. In FIG. 8, the X-axis direction represents the direction of extension of the electrodes of the electrostatic capacitance detection device according to Embodiment 1, the Y-axis direction represents the direction of transporting a reading object (detection object) on which a variation in electrostatic capacity is detected in the electrostatic capacitance detection device, and the Z-axis direction represents the height direction. In FIGS. 9 to 14, the X-axis direction represents the main scanning direction of the image reading device according to Embodiment 1, the Y-axis direction represents the direction of transporting the reading object (detection object) in the image reading device, and the Z-axis direction represents the height direction (optical axis direction). The space through which the reading object (detection object) is transported is called a transport path. The transport of the reading object (detection object) may also be relative transport. That is, the image reading device (electrostatic capacitance detection device) may shift relative to the still reading object (detection object). The reading object (detection object), which is not illustrated, is a sheet-like medium including a paper sheet, such as a printed material including bank note or security. The identical or corresponding components are indicated by the same reference symbol in the drawings and are not redundantly described.

In FIGS. 1 to 11, a housing 1 is made of materials containing at least an electrically conductive material, and includes an electrically conductive surface 2 in at least part of the surface. The housing 1 is provided with a ground conductor 3 being present on a plane different from the plane including the electrically conductive surface 2. The plane including the electrically conductive surface 2 is preferably parallel to the different plane (plane including the ground conductor 3). The housing 1 is also provided with a ground auxiliary conductor 4, which is an electrically conductive sheet 4 to connect the electrically conductive surface 2 to the ground conductor 3 electrically. The ground auxiliary conductor 4 (electrically conductive sheet 4) is formed over the level difference existing between the plane including the electrically conductive surface 2 and the plane including the ground conductor 3. The electrically conductive surface 2 is preferably a surface of an electrically conductive filler exposed from the surface of the housing 1.

In FIGS. 1 to 11, the ground auxiliary conductor 4 preferably is bent at the end of a portion connected to the electrically conductive surface 2 electrically and is formed over the level difference. That is, the ground auxiliary conductor 4 preferably has a bent portion 5 in accordance with the level difference. Examples of the bent portion 5 in accordance with the level difference include a portion bent in accordance with the shape of the level difference, a portion curved in accordance with the shape of the level difference, a bent portion having the same shape as the level difference, and a curved portion having the same shape as the level difference. Another example of the bent portion 5 in accordance with the level difference is a portion existing over the level difference with the shortest length. The housing 1 is preferably a frame body 1 supporting a dielectric plate 6, and the dielectric plate 6 is preferably made of glass or transparent resin. The dielectric plate 6 has one surface 7 (first surface 7) and another surface 8 (second surface 8). The ground conductor 3 extends on the another surface 8 of the dielectric plate 6. The second surface 8 is located on the same side as the electrically conductive surface 2 of the housing 1.

Figure 7:
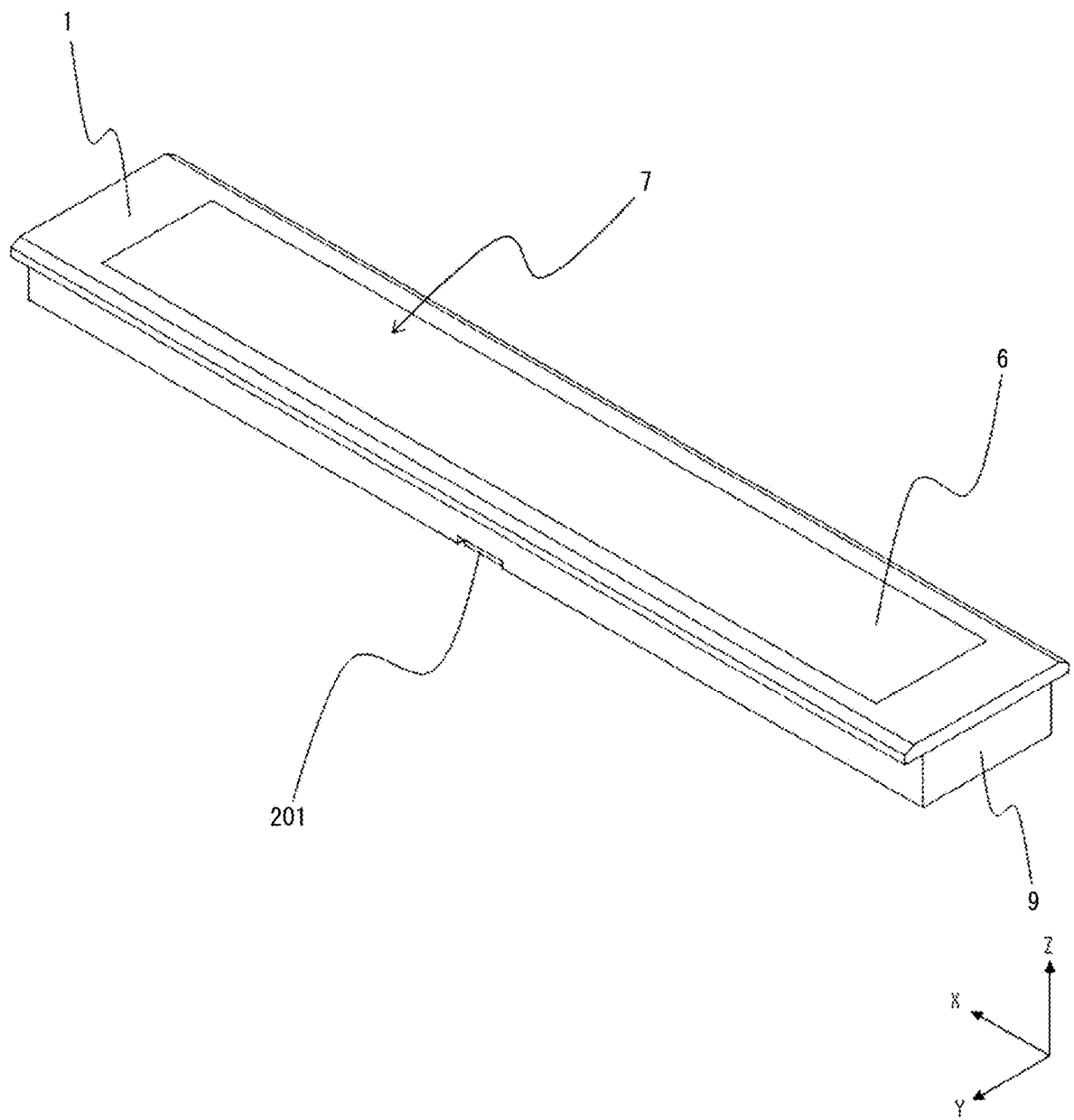
FIG. 7 is a perspective view of the device housing according to Embodiment 1 including a first housing and a second housing.
Figure 8:
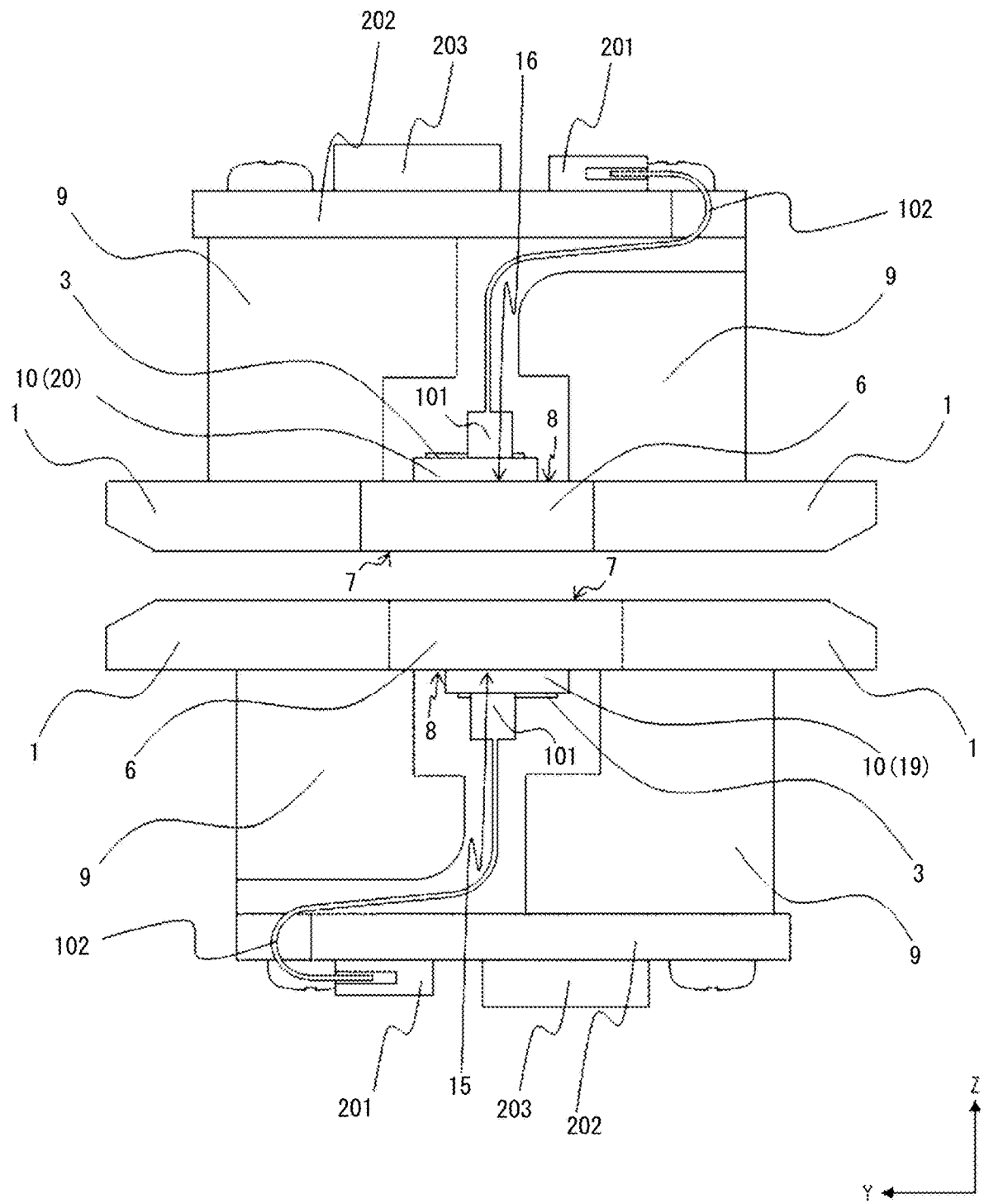
FIG. 8 is a sectional view of an electrostatic capacitance detection device according to Embodiment 1.

The device housing according to Embodiment 1 may further include a second housing 9, as illustrated in FIG. 7. The second housing 9 has a box shape having an opening. The housing 1 is disposed to cover the opening of the second housing 9. The housing 1 and the second housing 9 form an installation space therebetween. The housing 1 serves as a first housing 1 or a cover 1, in contrast to the second housing 9. The second housing 9 is also called a frame 9. The second housing 9 may also be made of materials containing an electrically conductive material like the first housing 1 (housing 1), or may be made of a non-conductive material. FIG. 7 illustrates an example in which the housing 1 supports the dielectric plate 6, the housing 1 is the frame body 1 in which the electrically conductive filler underlies (is inserted), and the dielectric plate 6 is made of glass. In FIG. 7, the housing 1 and the second housing 9 each have a rectangular shape extending in the longitudinal and transverse directions. That is, the ground auxiliary conductor 4 (electrically conductive sheet 4) is disposed in the installation space.

Figure 2:
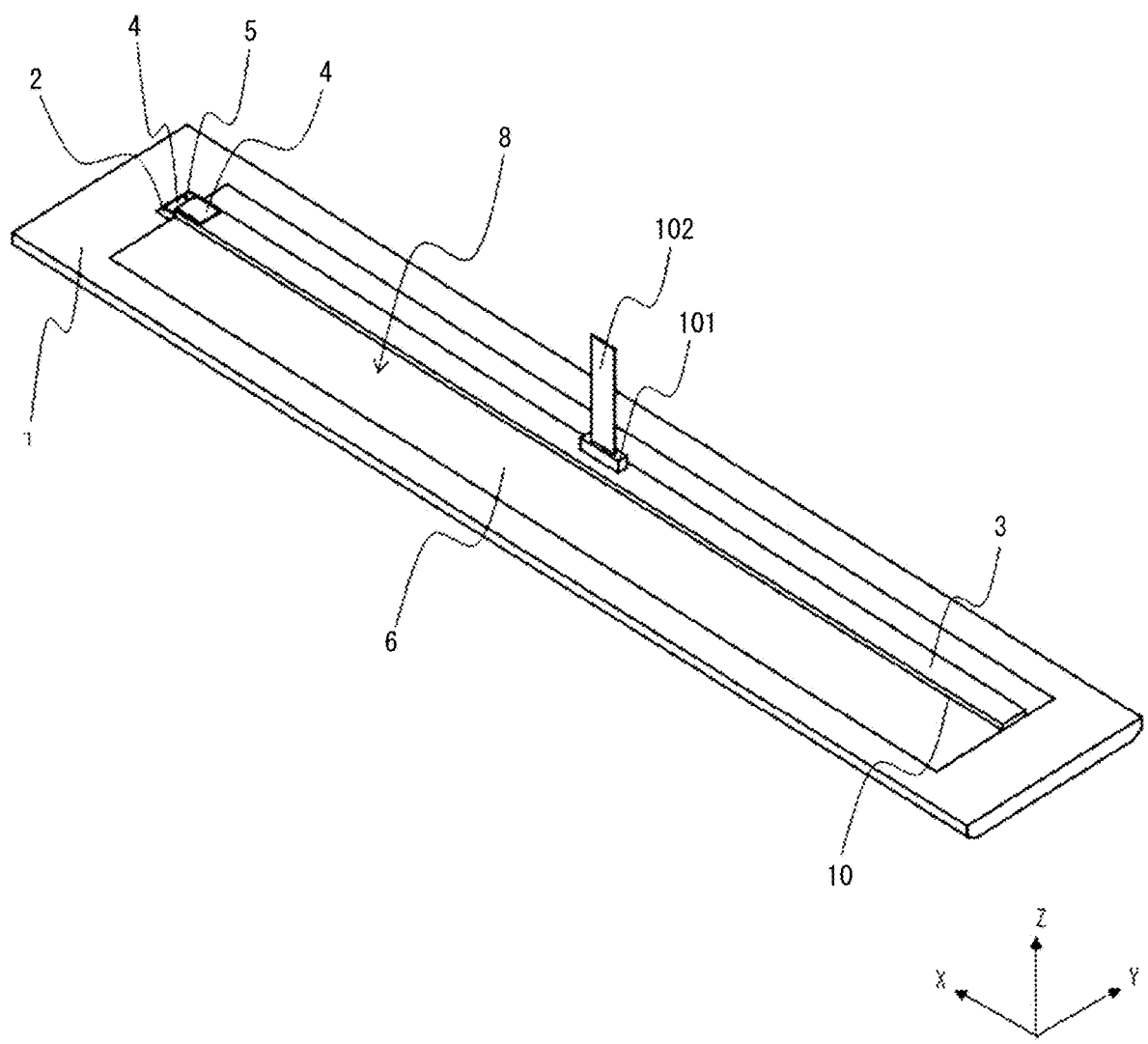
FIG. 2 is a perspective view of the device housing (frame body) according to Embodiment 1.
Figure 3:
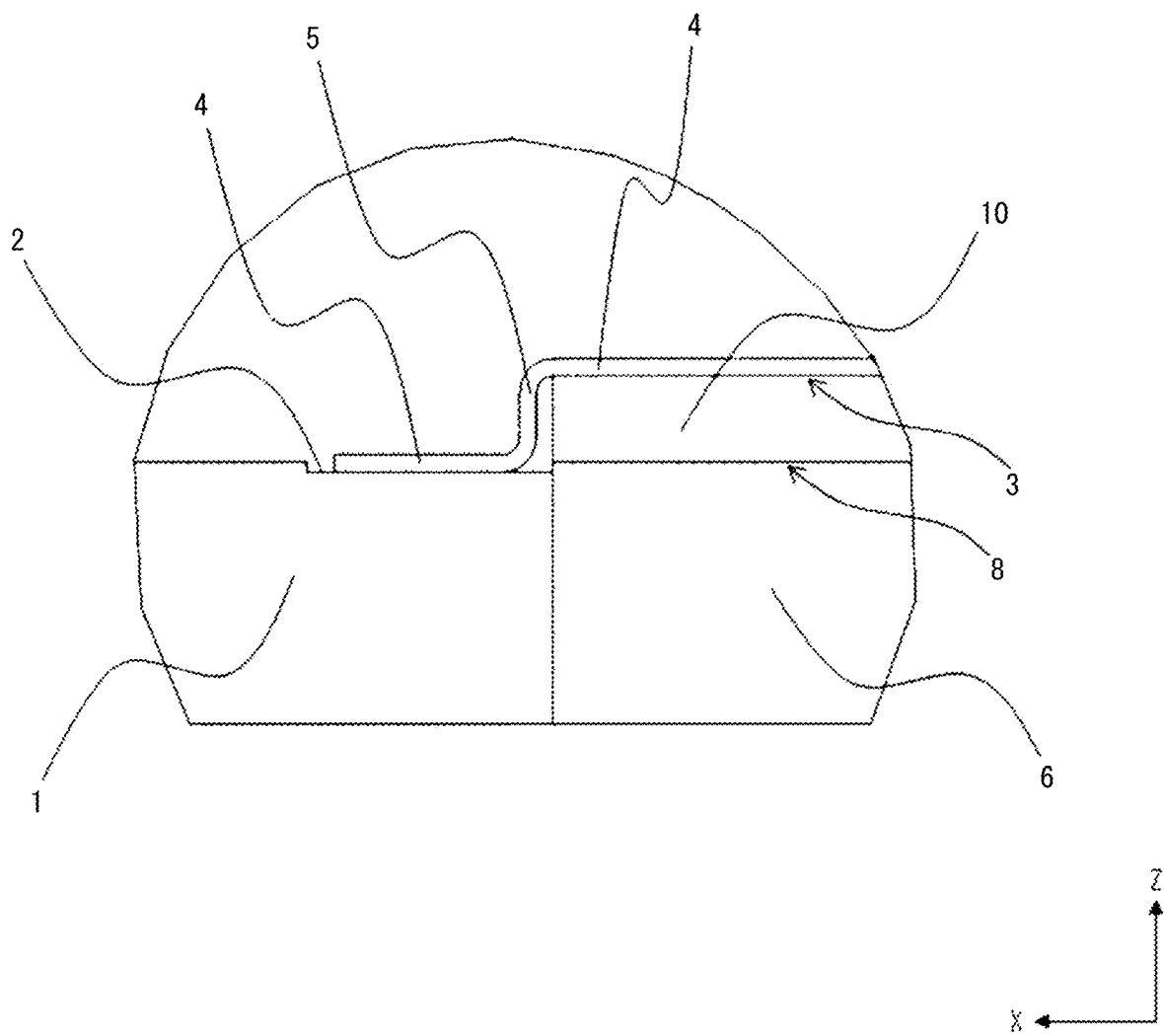
FIG. 3 is a partial sectional view of the device housing (frame body) according to Embodiment 1.

The following description is directed to an exemplary method of fabricating (assembling) the device housing according to Embodiment 1. In this exemplary method, the housing 1 supports the dielectric plate 6, the housing 1 is the frame body 1 in which the electrically conductive filler underlies (is inserted), and the dielectric plate 6 is made of glass. In this case, the housing 1 (frame body 1 or cover 1) and the dielectric plate 6 function as a glass-integrated cover illustrated in FIGS. 1, 2, and 3. FIG. 1 is an enlarged perspective view of a portion around the electrically conductive surface 2 of the glass-integrated cover illustrated in FIG. 2. FIG. 3 is a sectional view of the enlarged perspective view of the glass-integrated cover illustrated in FIG. 2 in a portion around the electrically conductive surface 2 taken along a plane in which the X and Z axes intersect each other. In other words, FIG. 3 is a sectional view of the end portion of the housing 1 in the longitudinal direction. The housing 1 has a rectangular shape extending in the longitudinal and transverse directions. The dielectric plate 6 may also have a rectangular shape extending in the longitudinal and transverse directions. The housing 1 is provided with the electrically conductive surface 2 in the end portion in the longitudinal direction along the transverse direction.

First, the surface layer of an end portion of the glass-integrated cover, in detail, the end portion of the housing 1 in the longitudinal direction is removed with a laser marker to expose an electrically conductive filler, thereby yielding the electrically conductive surface 2. The laser marker does not apply load on the electrically conductive resin and can avoid deformation of the housing 1. One surface of the electrically conductive sheet 4 is connected to the ground conductor 3 serving as a ground of a substrate 10 electrically. The electrical connection is achieved by, for example, providing an electrically conductive adhesive layer on one surface of the electrically conductive sheet 4 to fix the electrically conductive sheet 4 on the substrate 10 while maintaining electrical connection. The electrically conductive sheet 4 is then bent to form the bent portion 5. The another surface of the electrically conductive sheet 4 is then fixed on the electrically conductive surface 2 in which the electrically conductive filler of the housing 1 is exposed, thereby achieving electrical connection between the ground conductor 3 and the housing 1.

Although the ground conductor 3 is an electrically conductive pattern provided on the substrate 10 extending in the longitudinal direction and disposed over the entire one surface of the substrate 10 in the drawings, this configuration is a mere example. The substrate 10 is preferably a circuit board including various circuits, and the ground conductor 3 is preferably a ground of the circuit board. This circuit board is provided with a connector 101 serving as an interface with external components, as illustrated in FIG. 2. To the connector 101, one terminal of a connecting cable 102 for establishing connection to the external components is inserted. The other terminal of the connecting cable 102 is inserted to a connector 201, described below.

Figure 4:
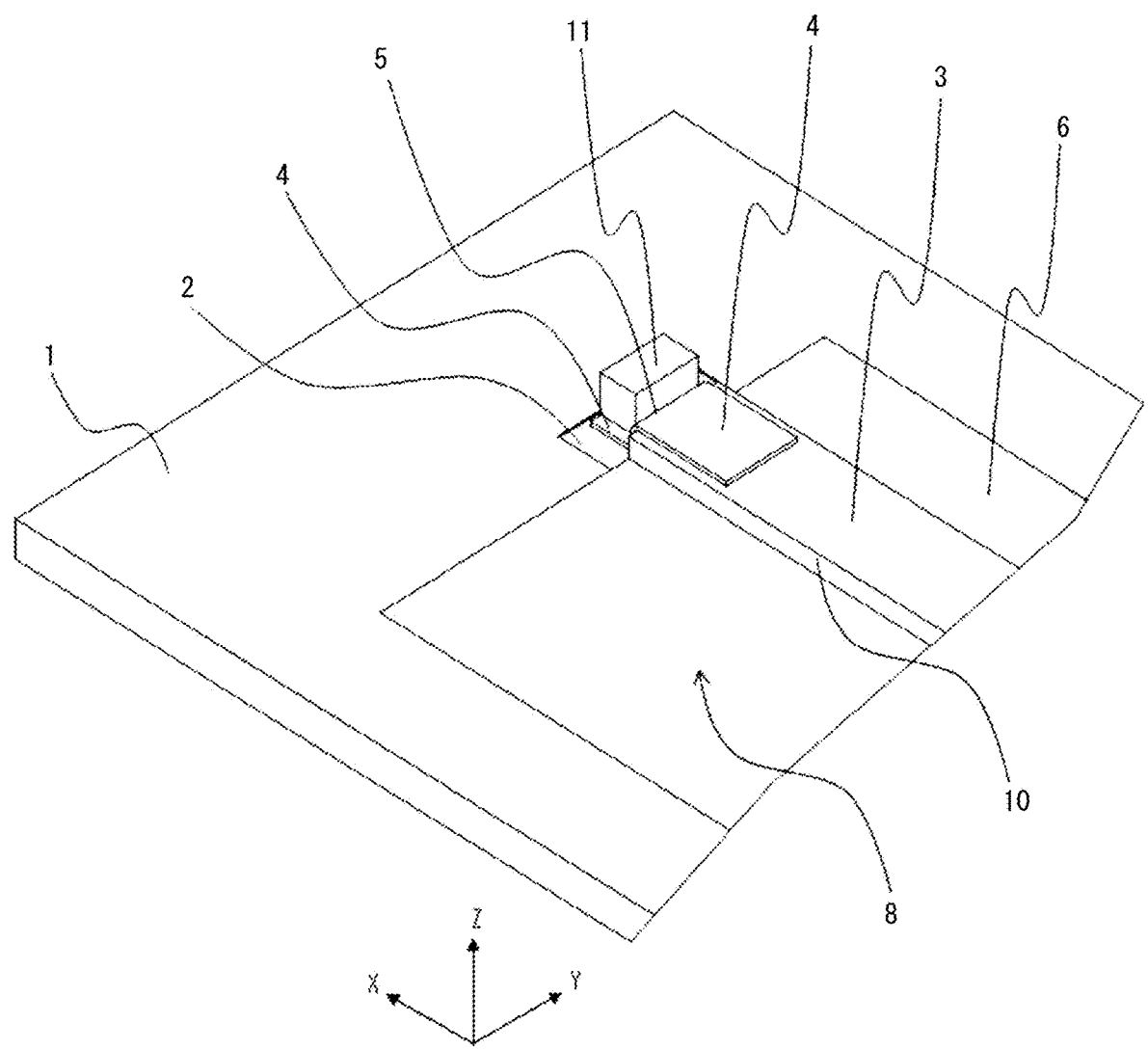
FIG. 4 is a partial perspective view of the device housing (frame body) according to Embodiment 1.
Figure 5:
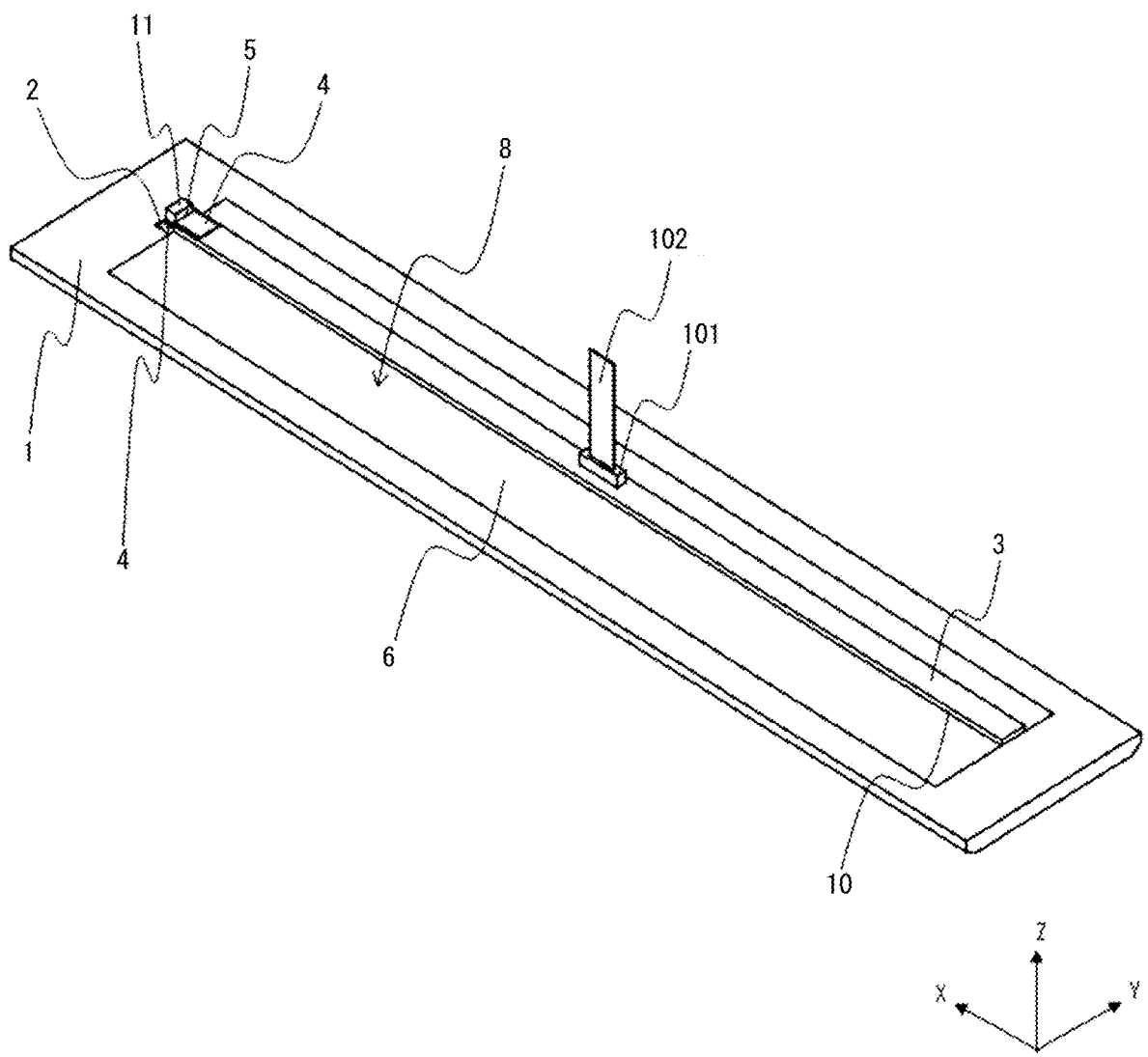
FIG. 5 is a perspective view of the device housing (frame body) according to Embodiment 1.
Figure 6:
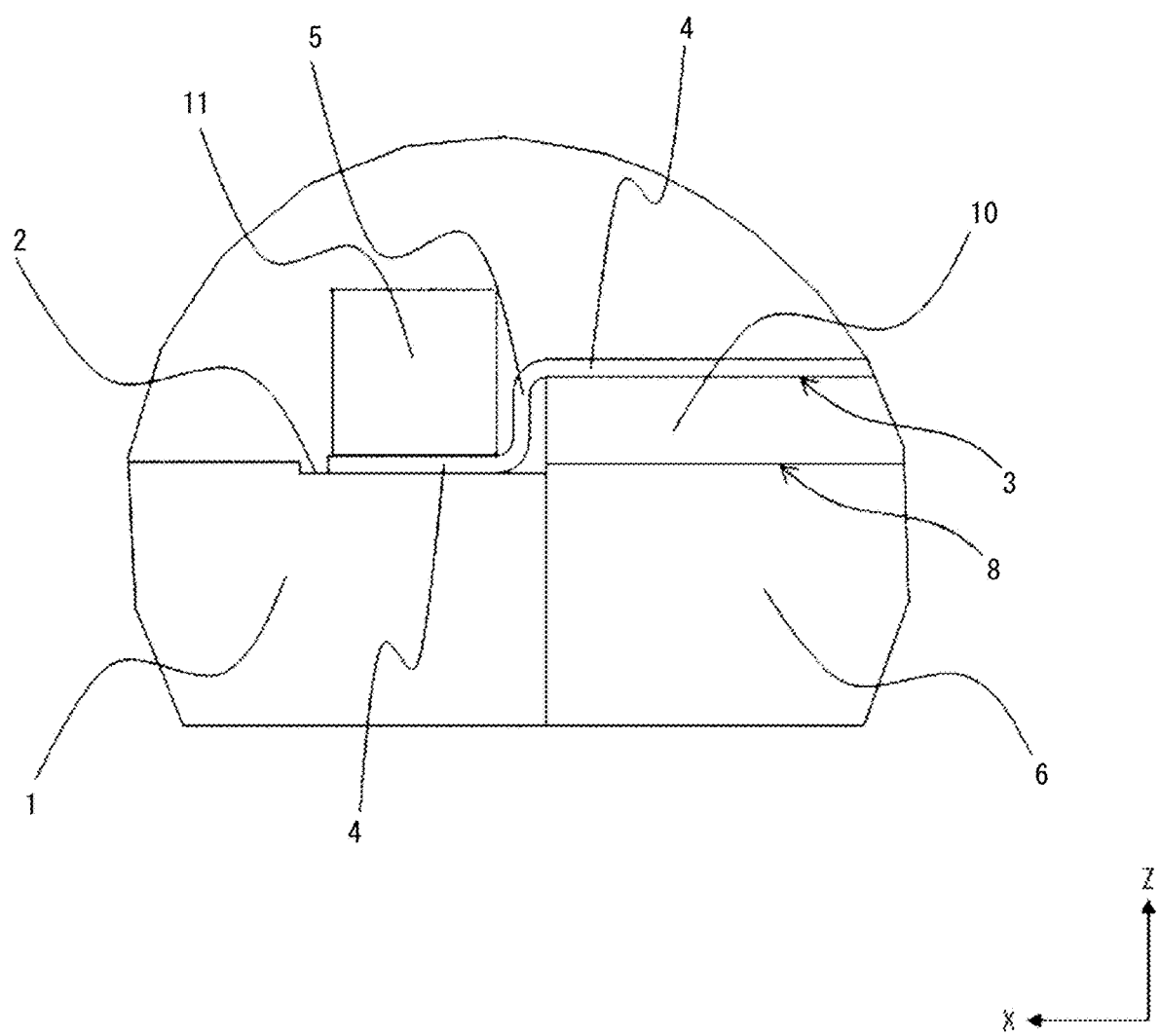
FIG. 6 is a partial sectional view of the device housing (frame body) according to Embodiment 1.

In order to further enhance the electrical connection between the electrically conductive surface 2 and the electrically conductive sheet 4 illustrated in FIGS. 1, 2, and 3, the device housing according to Embodiment 1 preferably further includes an elastic body 11, as illustrated in FIGS. 4, 5, and 6. This elastic body 11 may press the electrically conductive sheet 4 (ground auxiliary conductor 4) from the surface opposite to the electrically conductive surface 2, and thereby connect the electrically conductive sheet 4 to the electrically conductive surface 2 electrically. In this case, the electrical connection between the electrically conductive surface 2 and the electrically conductive sheet 4 can be achieved by only a pressing force from the elastic body 11. FIG. 4 is an enlarged perspective view of a portion around the electrically conductive surface 2 of the glass-integrated cover illustrated in FIG. 5. FIG. 6 is a sectional view of the enlarged perspective view of the glass-integrated cover illustrated in FIG. 5 in a portion around the electrically conductive surface 2 taken along a plane in which the X and Z axes intersect each other. That is, FIGS. 4, 5, and 6 correspond to FIGS. 1, 2, and 3, respectively.

An exemplary method of fabricating the device housing according to Embodiment 1 in this case is described below. First, the elastic body 11 is bonded to the surface of the electrically conductive sheet 4, opposite to the surface fixed to the electrically conductive surface 2, with a double-sided tape, for example. In the exemplary case of bonding of the elastic body 11 to the electrically conductive sheet 4 with a double-sided tape, the elastic body 11 is preferably compressed on the surface of the elastic body 11 opposite to the surface provided with the double-sided tape, that is, compressed on the surface of the elastic body 11 opposite to the surface closer to the electrically conductive surface 2. In the case of another procedure for bonding the elastic body 11 to the surface of the electrically conductive sheet 4 opposite to the surface fixed to the electrically conductive surface 2, the elastic body 11 is preferably compressed on the surface opposite to the surface in contact with the electrically conductive sheet 4, that is, compressed on the surface opposite to the surface closer to the electrically conductive surface 2. These exemplary compression procedures are preferably executed by means of the above-described second housing 9 illustrated in FIG. 7 or a protrusion of the second housing 9 protruding in the installation space. The protrusion to compress the elastic body 11 may be the second housing 9 or another component.

In order to compress the elastic body 11 by means of the protrusion, the elastic body 11 and the protrusion of the second housing 9 are preferably arranged such that the protrusion compresses the surface of the elastic body 11 opposite to the surface provided with the double-sided tape while the first housing 1 is mounted on the second housing 9, for example. This configuration can constantly apply a compressive force on the electrically conductive sheet 4 in the installation space while the first housing 1 is mounted on the second housing 9. Although the protrusion of the second housing 9 directly presses the elastic body 11 in the above-described example, the elastic body 11 may also be indirectly pressed by another member fixed by the mounting of the first housing 1 on the second housing 9. Alternatively, the elastic body 11 may also be indirectly pressed by another member fixed in the installation space.

The electrically conductive filler of the first housing 1 is a minute component. Accordingly, the electrical connection cannot be stabilized only by placing the electrically conductive sheet 4 on the electrically conductive surface 2 in which the electrically conductive filler of the first housing 1 is exposed, in some cases, and may be lost due to a variation in external environment, such as a small shock or a variation in temperature. In contrast, the device housing according to Embodiment 1 can achieve stable electrical connection between the electrically conductive sheet 4 and the first housing 1 because of a constant force of urging the electrically conductive sheet 4 by the elastic body 11 onto the electrically conductive surface 2.

As described above, the device housing according to Embodiment 1 may include the substrate 10 to be provided with the ground conductor 3. If the substrate 10 provided with the ground conductor 3 is allowed to serve as a circuit board, the substrate 10 can be used as an apparatus (device) including the device housing according to Embodiment 1. In other words, the ground layer of the circuit board of the apparatus (device) including the device housing according to Embodiment 1 can be used as the ground conductor 3. The following description is directed to an example in which the apparatus (device) including the device housing according to Embodiment 1 is an electrostatic capacitance detection device, with reference to FIG. 8. FIG. 8 is a sectional view of the electrostatic capacitance detection device taken along the plane in which the Y and Z axes intersect each other. The identical or corresponding components are indicated by the same reference symbol in the drawings and are not redundantly described.

The electrostatic capacitance detection device according to Embodiment 1 includes two device housings according to Embodiment 1 facing each other. The electrostatic capacitance detection device according to Embodiment 1 includes a first electrode 15 and a second electrode 16 disposed in the respective installation spaces, an oscillator circuit 17 to generate an electric field between the first electrode 15 and the second electrode 16, a detection circuit 18 to detect a variation in electrostatic capacity between the first electrode 15 and the second electrode 16, and a first substrate 19 and a second substrate 20 provided with at least one of the oscillator circuit 17 or the detection circuit 18. The oscillator circuit 17 and the detection circuit 18 are not illustrated in detail. A detection object (reading object), on which a variation in electrostatic capacity is detected in the electrostatic capacitance detection device, is transported through the transport path in the transport direction (transverse direction). The transport path indicates the space existing between the respective first surfaces 7 of the two device housings according to Embodiment 1 that face each other.

The first electrode 15 and the second electrode 16 continuously or intermittently extend in the longitudinal direction. That is, the first electrode 15 or the second electrode 16 is not necessarily a continuous pattern. The first electrode 15 and the second electrode 16 may have the identical shape. The first electrode 15 and the second electrode 16 generate an electric field in the height direction, and thus detect a variation in electrostatic capacity caused by the detection object passing through the electric field. The first electrode 15 and the second electrode 16 are not necessarily completely opposed to each other and may be deviated from each other in the transport direction provided that the electrodes can generate an electric field. The two substrates 10 of the respective device housings according to Embodiment 1 serve as the first substrate 19 and the second substrate 20. Each of the substrates 10 (first substrate 19 and the second substrate 20) extends in the longitudinal direction. In FIGS. 1 to 8, the substrate 10 extends over the dielectric plate 6 in the longitudinal direction.

As illustrated in FIG. 8, each of the first electrode 15 and the second electrode 16 is disposed on the surface of the substrate 10 facing the second surface 8 of the dielectric plate 6. In detail, the first electrode 15 is disposed on the surface of the first substrate 19 facing the second surface 8 of the dielectric plate 6. The second electrode 16 is disposed on the surface of the second substrate 20 facing the second surface 8 of the dielectric plate 6. In contrast, the ground conductor 3 is disposed on the surface of the substrate 10, opposite to the surface of the substrate 10 facing the second surface 8 of the dielectric plate 6. In other words, the dielectric plate 6, the first electrode 15 (second electrode 16), the substrate 10, and the ground conductor 3 are arranged in this order from the transport path. In the portion of electrical connection between the ground conductor 3 and the ground auxiliary conductor 4, the ground conductor 3 is located between the ground auxiliary conductor 4 and the substrate 10. The first electrode 15 and the second electrode 16 are preferably in contact with the respective dielectric plates 6.

As illustrated in FIG. 8, one terminal of the connecting cable 102 is inserted to the above-mentioned connector 101 in order to output signals from each of the substrates 10 (first substrate 19 and the second substrate 20) to the outside. The other terminal of the connecting cable 102 is inserted to the connector 201. The connector 201 is mounted on one surface of a signal processing circuit board 202. The one surface of the signal processing circuit board 202 is provided with components, such as the connector 201 [301] and a signal processing circuit 203, and receives screws to be fastened to the second housing 9, for example. The another surface of the signal processing circuit board 202 is in contact with the second housing 9.

The signal processing circuit board 202 is designed to close the installation space. In other words, the first housing 1 and the signal processing circuit board 202 serve as lids of the second housing 9 and thereby form the installation space. The signal processing circuit board 202 may also be retained in the installation space. The signal processing circuit board 202 (signal processing circuit 203) may have the functions of the oscillator circuit 17 and the detection circuit 18.

The electrostatic capacitance detection device according to Embodiment 1 may include an image reading device according to Embodiment 1, described below. That is, the electrostatic capacitance detection device according to Embodiment 1 may further include an optical component 12 disposed in the installation space and configured to converge light incident through the dielectric plate 6, and a light receiver 13 to receive the light converged by the optical component 12. The optical component 12 and the light receiver 13 are described below in the detailed description of the image reading device according to Embodiment 1.

Figure 11A:
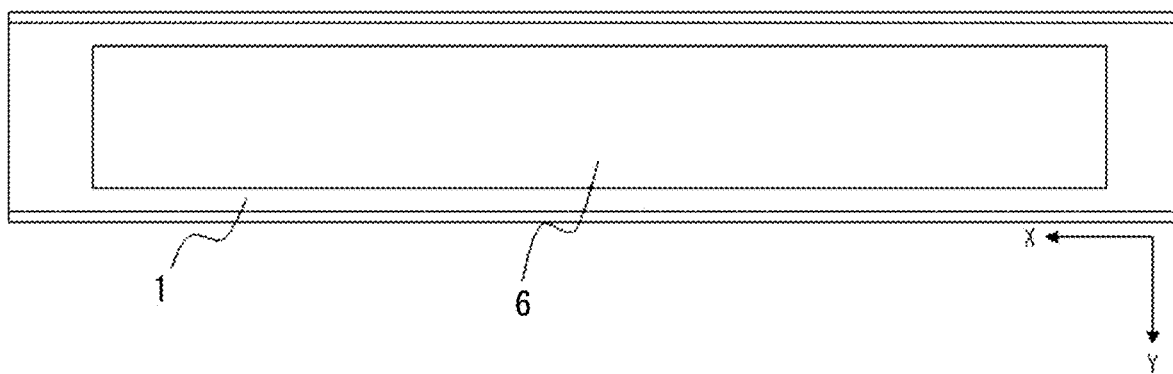
FIGS. 11A to 11D illustrates appearances of the image reading device according to Embodiment 1.
Figure 11B:
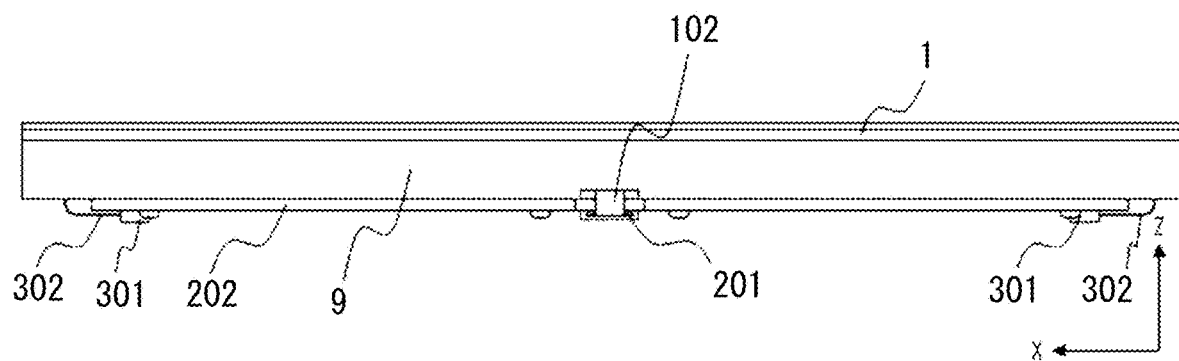
Figure 11C:
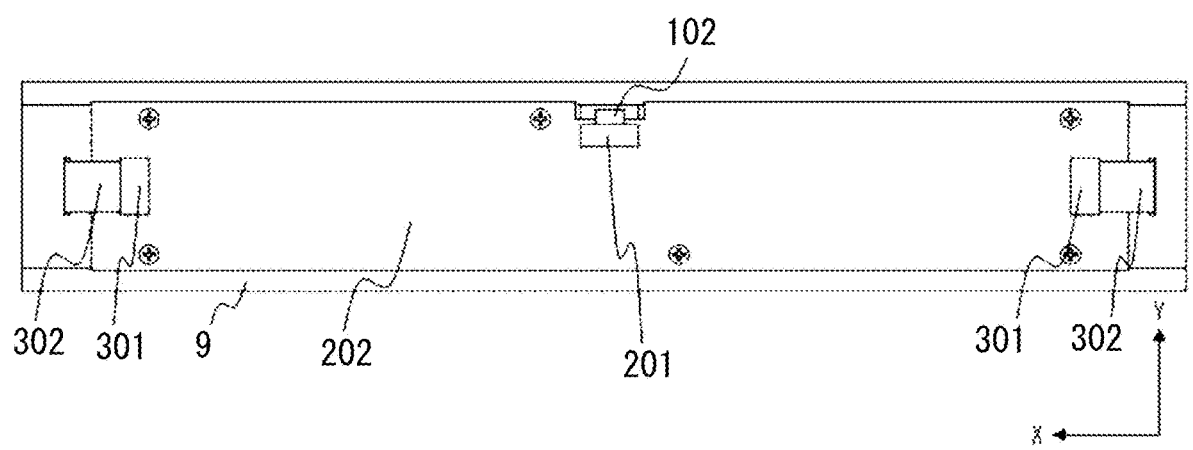
Figure 11D:
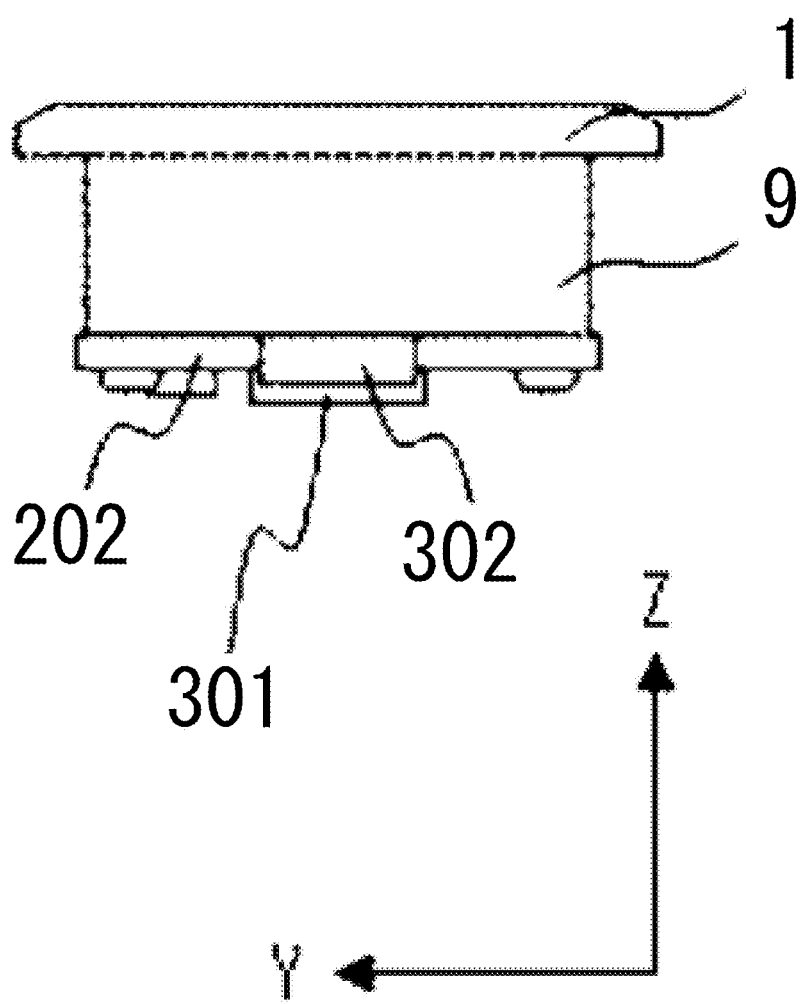
Figure 12:
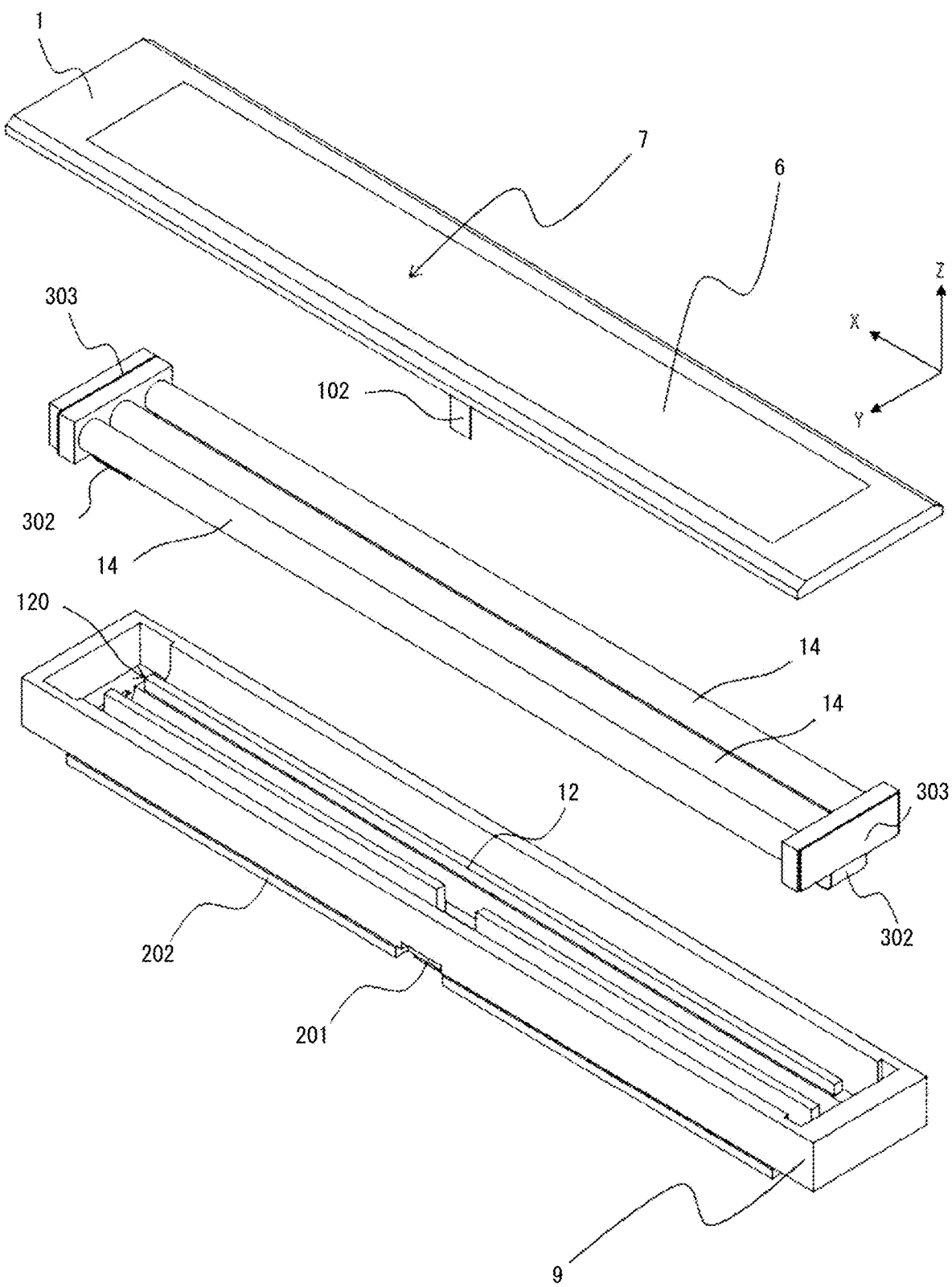
FIG. 12 is an exploded view of the image reading device (electrostatic capacitance detection device) according to Embodiment 1.
Figure 13:
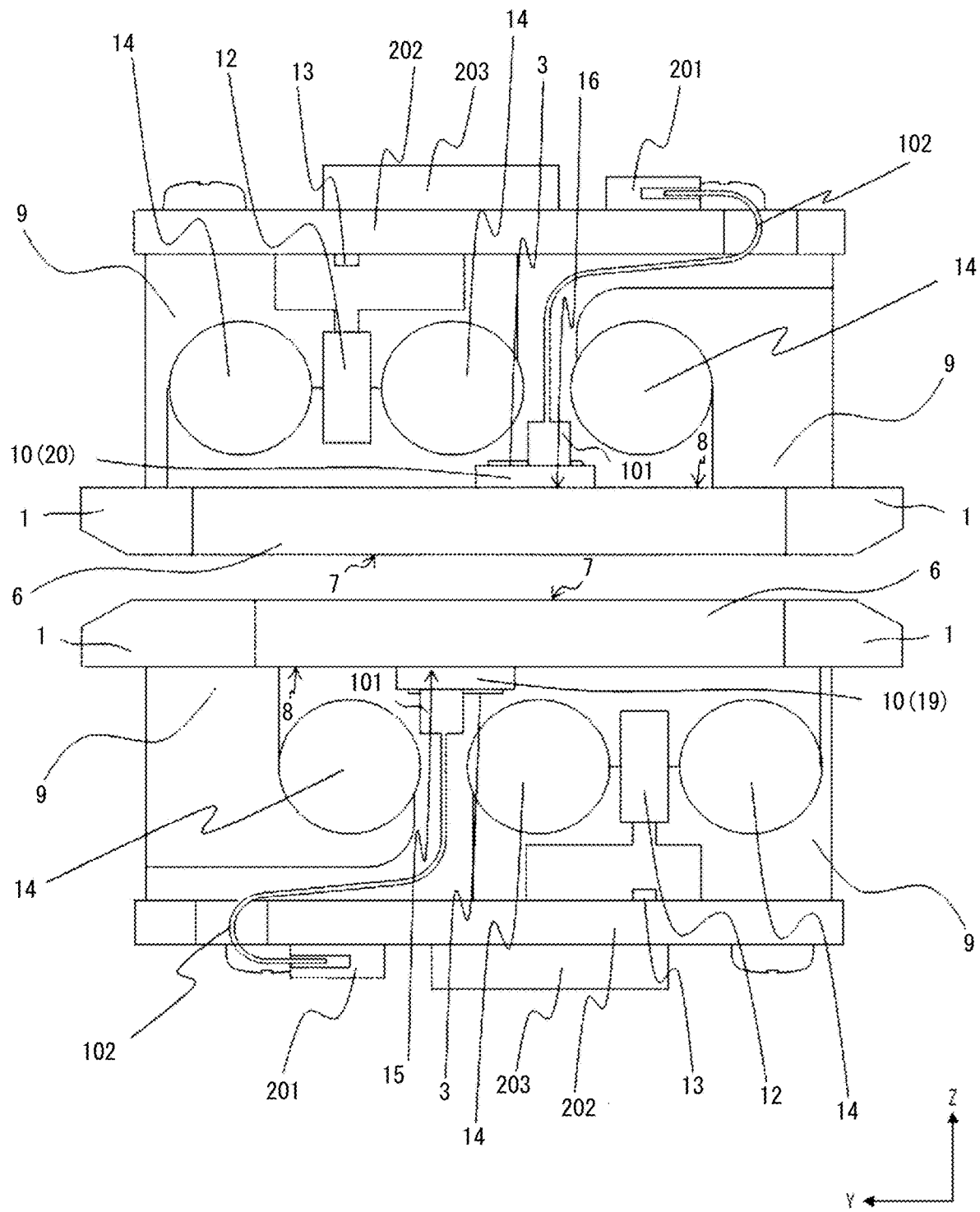
FIG. 13 is a sectional view of a modification of the image reading devices (electrostatic capacitance detection devices) according to Embodiment 1.
Figure 14:
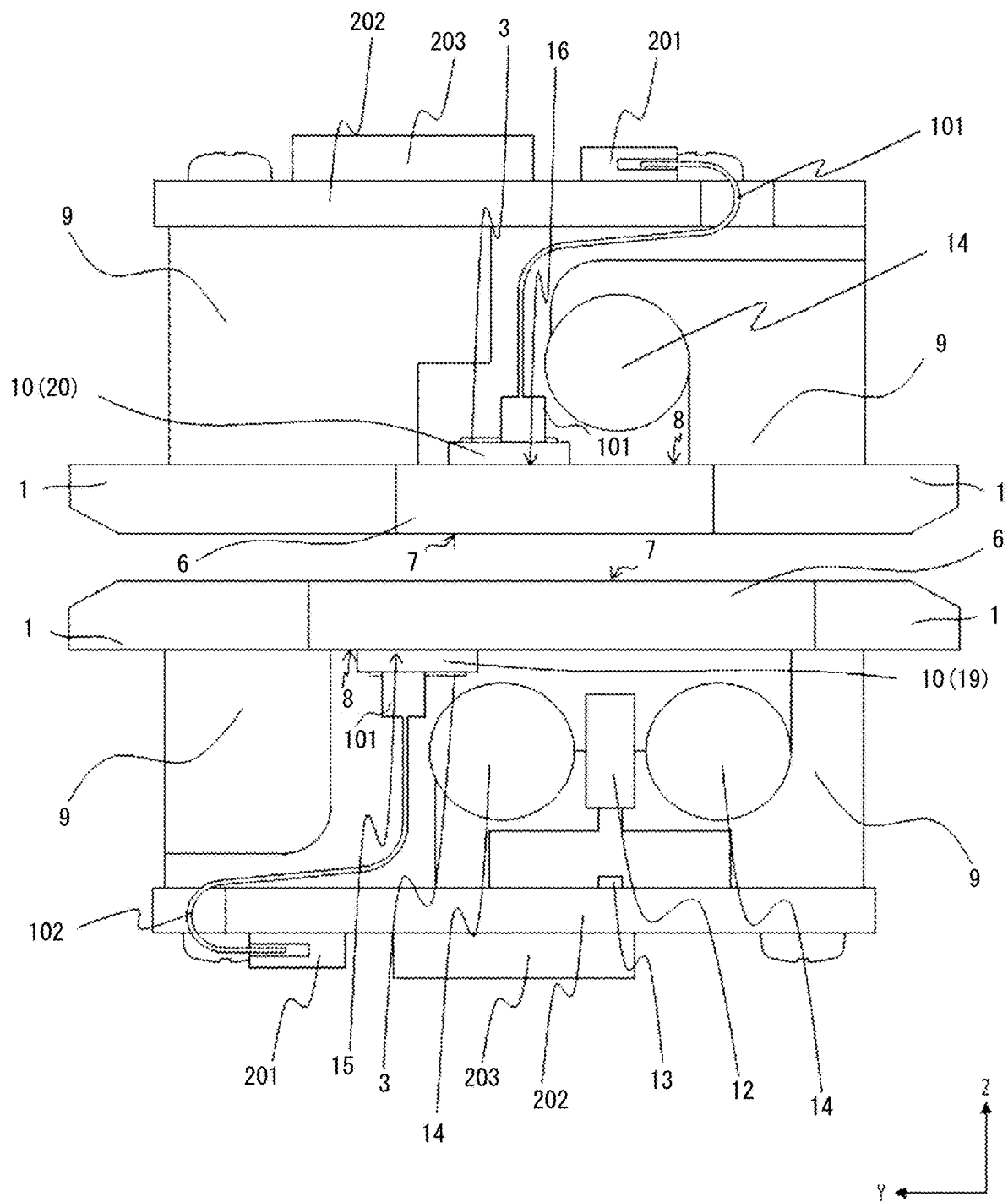
FIG. 14 is a sectional view of a modification of the image reading devices (electrostatic capacitance detection devices) according to Embodiment 1.

The following description is directed to an example in which the device housing according to Embodiment 1 is included in an image reading device as a housing, with reference to FIGS. 9 to 14. The identical or corresponding components are indicated by the same reference symbol in the drawings and are not redundantly described. Although the image reading device according to Embodiment 1 in FIGS. 9 to 14 includes the electrostatic capacitance detection device according to Embodiment 1, the image reading device may also be an independent device without the electrostatic capacitance detection device according to Embodiment 1. A reading object (detection object), on which an image is read in the image reading device, is transported through the transport path in the transport direction (transverse direction). The transport path of the image reading device illustrated in FIGS. 9 to 12 is the space above the first surface 7 of the image reading device (device housing) according to Embodiment 1. In detail, the transport path is the space above the first surface 7 opposite to the second surface 8. The transport path of the image reading device illustrated in FIGS. 13 and 14 is the space existing between the respective first surfaces 7 of the two image reading devices (device housings) according to Embodiment 1 that face each other.

Figure 9A:
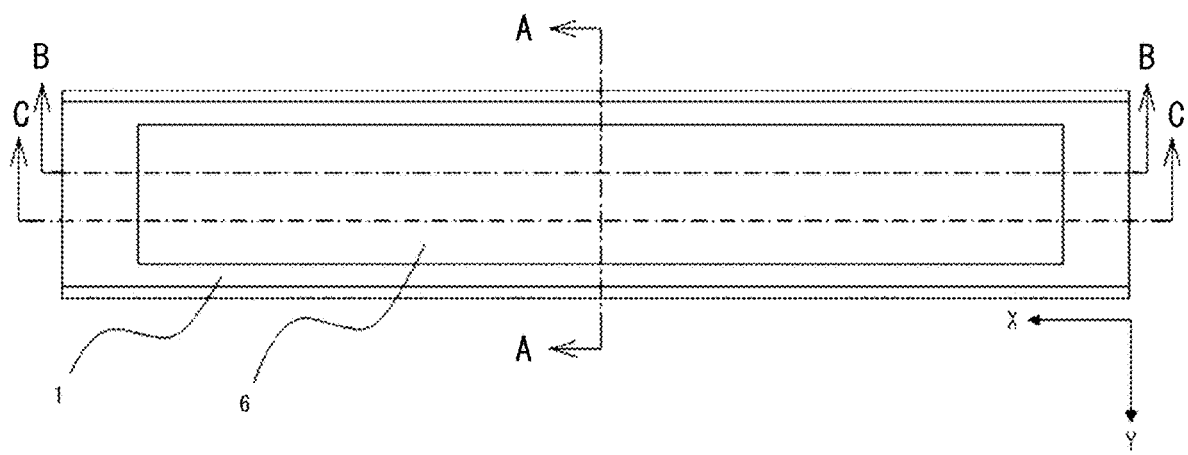
FIG. 9A is a top view of an image reading device according to Embodiment 1.
Figure 9B:
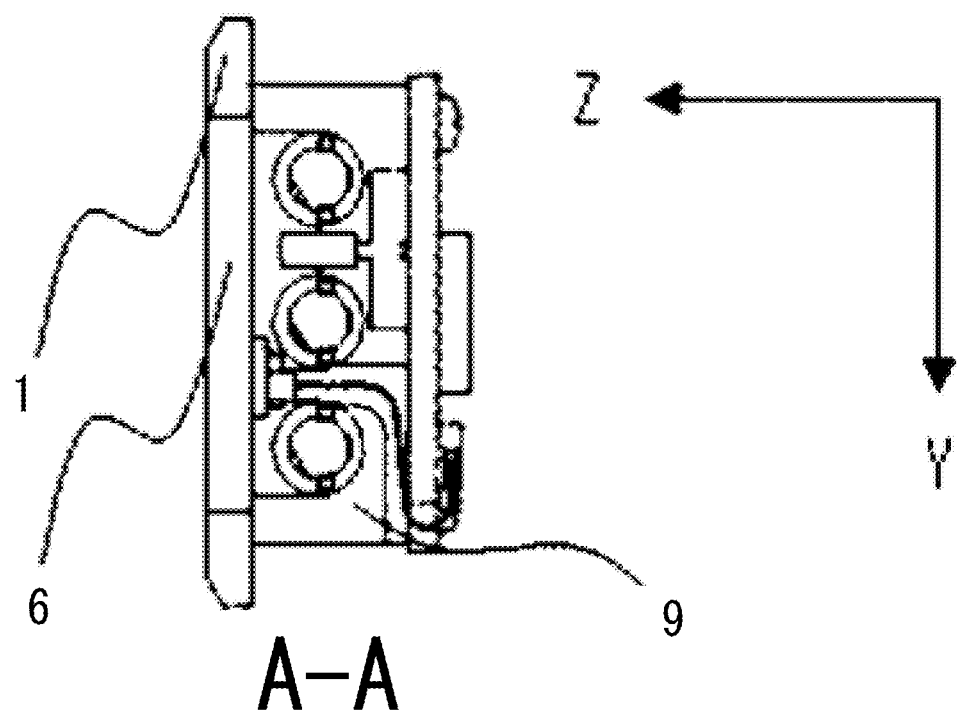
FIGS. 9B to 9D are sectional views of the image reading device according to Embodiment 1.
Figure 9C:
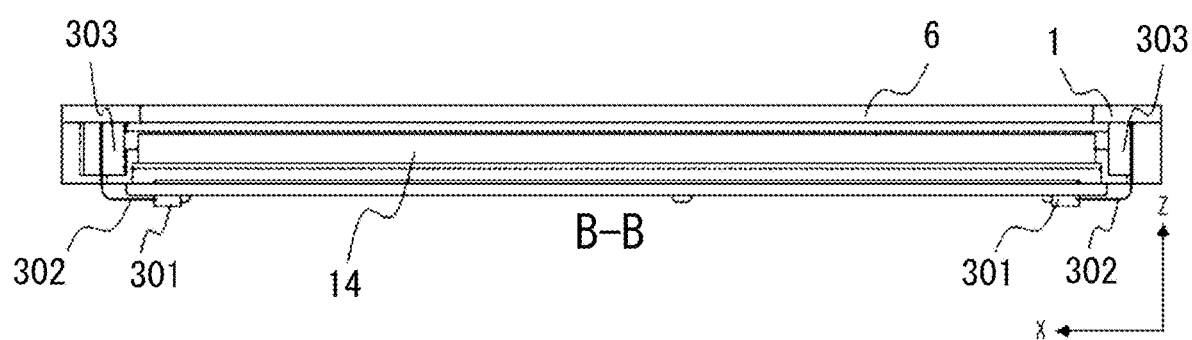
Figure 9D:
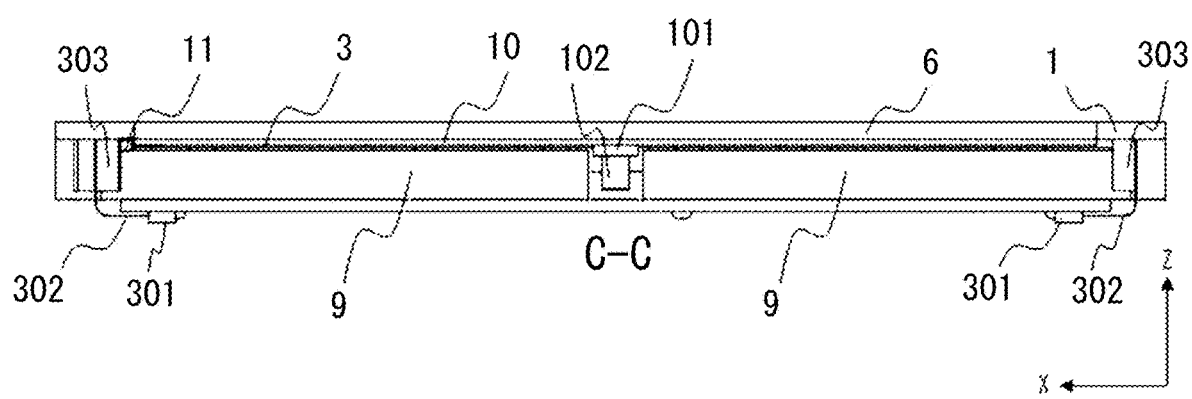
Figure 10:
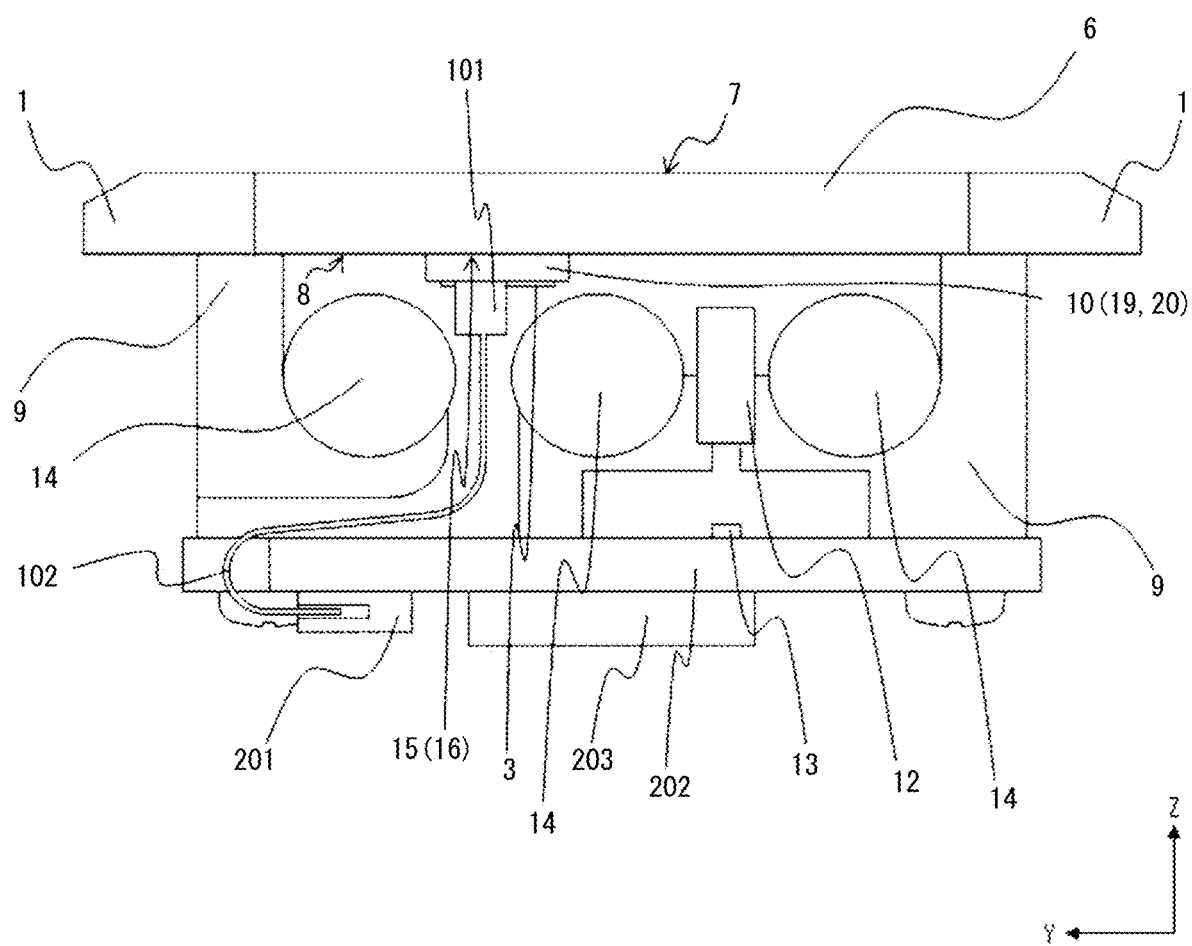
FIG. 10 illustrates appearances of the image reading device according to Embodiment 1.

FIG. 9A is a top view of each of the image reading devices in the plane in which the X and Y axes intersect each other. FIG. 9B is a sectional view of the image reading device taken along the line segment A-A of FIG. 9A (that is, a sectional view taken along the plane in which the Y and Z axes intersect each other). FIG. 9C is a sectional view of the image reading device taken along the dashed and single-dotted line segment B-B of FIG. 9A (that is, a sectional view taken along the plane in which the X and Z axes intersect each other). FIG. 9D is a sectional view of the image reading device taken along the dashed and single-dotted line segment C-C of FIG. 9A (that is, a sectional view taken along the plane in which the X and Z axes intersect each other). FIG. 10 is an enlarged view of FIG. 9B. FIG. 11A is a top view of the image reading device on the side existing the first housing 1 viewed from the plane in which the X and Y axes intersect each other, and corresponds to FIG. 9A. FIG. 11B is a side view of the image reading device in the plane in which the X and Z axes intersect each other. FIG. 11C is a bottom view of the image reading device on the side existing the signal processing circuit board 202 viewed from the plane in which the X and Y axes intersect each other. FIG. 11D is a side view of the image reading device in the plane in which the Y and Z axes intersect each other. FIG. 12 is an exploded perspective view of the image reading device.

The image reading device according to Embodiment 1 includes the device housing according to Embodiment 1, an optical component 12 disposed in the installation space and configured to converge light incident through the dielectric plate 6, and a light receiver 13 to receive the light converged by the optical component 12. The image reading device according to Embodiment 1 may also be a contact image sensor, as illustrated in FIGS. 11 and 12. In this case, the optical component 12 is a lens array 12 including multiple lenses arranged in the longitudinal direction (main scanning direction), and the light receiver 13 is a sensor element array 13 including multiple sensor elements arranged in the longitudinal direction (main scanning direction). The lens array 12 may also be a rod lens array 12 (illustrated in the drawings) or a microlens array 12. In this case, the optical component 12 includes multiple rod lenses or microlenses arranged in the longitudinal direction (main scanning direction).

In other words, the image reading device according to Embodiment 1 includes the device housing according to Embodiment 1, the optical component 12, which is the lens array 12 extending in the longitudinal direction (main scanning direction), disposed in the installation space and configured to converge light incident through the dielectric plate 6, and the light receiver 13, which is the sensor element array 13 including multiple sensor elements arranged in the longitudinal direction (main scanning direction), to receive the light converged by the optical component 12. The present disclosure is directed to an example in which the sensor elements are mounted on the signal processing circuit board 202. The signal processing circuit board 202 is therefore also called a sensor substrate 202.

As described above, the protrusion to compress the elastic body 11 may be a component of the second housing 9 or another component. That is, the elastic body 11 may be compressed by an end 120 of the lens array 12 fixed to the second housing 9 illustrated in FIG. 12. The elastic body 11 pressed by the lens array 12 (end 120) presses the ground auxiliary conductor 4, as illustrated in the drawings. In detail, the optical component 12 is configured such that the lens array 12 is in contact with the ground auxiliary conductor 4 at the end in the longitudinal direction (main scanning direction).

The electrically conductive surface 2 and the lens array 12 are preferably arranged in the same straight line in the main scanning direction (longitudinal direction). This configuration can facilitate the lens array 12 (end 120) to press the elastic body 11 on the electrically conductive surface 2. In the case where the electrically conductive surface 2 and the lens array 12 are deviated from each other in the transport direction (transverse direction), an elastic body 11 elongated in the transport direction (transverse direction) can allow the lens array 12 (end 120) to press the elastic body 11. The elastic body 11 in this case is also disposed over a part of the first housing 1 other than the electrically conductive surface 2.

In the case where the electrically conductive surface 2 and the ground conductor 3 (substrate 10) are not arranged in the same straight line in the main scanning direction (longitudinal direction), the shape and position of the ground auxiliary conductor 4 (electrically conductive sheet 4) having the bent portion 5 are preferably modified. That is, the ground auxiliary conductor 4 (electrically conductive sheet 4) preferably has a shape in accordance with the deviation between the electrically conductive surface 2 and the ground conductor 3 (substrate 10) in the main scanning direction (longitudinal direction). Although the ground auxiliary conductor 4 is the electrically conductive sheet 4 having a rectangular shape in the drawings of the present disclosure, the electrically conductive surface 2 and the ground conductor 3 (substrate 10) deviated from each other in the transport direction (transverse direction) can be connected to each other electrically by the ground auxiliary conductor 4 (electrically conductive sheet 4) having a crank shape. Alternatively, the electrically conductive sheet 4 having a rectangular shape and oriented diagonally from the main scanning direction may be disposed between the electrically conductive surface 2 and the ground conductor 3 (substrate 10).

The image reading device according to Embodiment 1 may further include linear light sources 14 extending in the longitudinal direction (main scanning direction), as illustrated in the drawings. In the case of a colored substrate 10, the substrate 10 may also serve as a shading member for the linear light sources 14. FIGS. 9 to 12 illustrate an example of three linear light sources 14. These linear light sources 14 are accommodated in the installation space. The linear light sources 14 emit linear light through light guides extending in the longitudinal direction (main scanning direction) to the reading object. The present disclosure is directed to an example in which a control to turn on the linear light sources 14 or other controls are executed on the sensor substrate 202 (signal processing circuit board 202).

The sensor substrate 202 (signal processing circuit board 202) in this case is also called a light source control board 202. The sensor substrate 202 controls the linear light sources 14 via connecting cables 302 of which one terminals are inserted to connectors 301 (FIGS. 9 and 11). The other terminals of the connecting cables 302 are inserted to light sources 303. Each of the light sources 303 includes light source elements, a light source substrate provided with the light source elements, and a light guide holder to retain the ends of the light guides (linear light sources 14). A preferable example of the light source elements is a light emitting diode (LED). The emitted light may be selected or combined from among light having various wavelengths, such as visible light, infrared light, and ultraviolet light. The light source substrate may be provided with a heat sink or heat emitting element to discharge heat of the light source substrate to the second housing 9 via the heat sink or heat emitting element.

For example, as illustrated in FIG. 12, the ends of the light guides in the longitudinal direction are inserted to the light guide holders of the light sources 303. Each of the light guide holders is provided with the light source substrate on the side opposite to the side of the light guides, and the end faces of the light guides face the light source elements mounted on the light source substrate inside the light guides. The light emitted from the light source elements are incident via the light guide holder to the end faces of the light guides. The incident light is guided inside the light guides in the longitudinal direction and exits from the side surfaces, so that the reading object is irradiated with linear light. The light emitting surfaces of the light guides extending in the longitudinal direction and the scattering patterns of the light guides formed in the longitudinal direction relative to the light emitting surfaces are not described in detail. The light guides in the present disclosure may be replaced with linear light sources 14 that directly emit light or LED array light sources including multiple LEDs arranged in the longitudinal direction. The light sources may also be a combination of an LED array light source and a light guide. Alternatively, the light sources may include or be combined with lenses.

The light guides (linear light sources 14) are provided with the light sources 303 at both ends in the illustrated example but may be provided with a single light source 303 alone at one end. The same holds true for the connectors 301 and the connecting cables 302. Since the light sources 303 are located at the ends in the longitudinal direction, the connectors 301 are preferably disposed at the ends in the longitudinal direction of the light source control board 202 (sensor substrate 202 or signal processing circuit board 202). In the case where the light source control board 202 is retained outside the second housing 9, the second housing 9 preferably has holes for receiving the connecting cables 302 therethrough. The same holds true for a hole for receiving the connecting cable 102 in the electrostatic capacitance detection device An operation of the image reading device according to Embodiment 1 is described below with reference to FIG. 10. A reading object is irradiated with diagonal light from the light emitting surfaces of the two linear light sources 14 disposed on the front and rear side of the rod lens array 12 in the transport direction. The light reflected from the reading object is converged by the rod lens array 12 and is received at the sensor element array 13. The reading object is also irradiated with vertical light from the light emitting surface of the other linear light source 14. In order to receive light emitted vertically to the reading object and passing through the reading object, another image reading device is preferably disposed behind the reading object in the space above the first surface 7 opposite to the second surface 8 of the image reading device according to Embodiment 1. The linear light source 14 emitting light vertically to the reading object may be omitted in the case of no requirement to receive the light passing through the object.

A modification of the image reading devices (electrostatic capacitance detection devices) according to Embodiment 1 to satisfy the requirement to receive the light passing through the reading object is described below with reference to FIGS. 13 and 14. FIGS. 13 and 14 are each a sectional view of a modification of the image reading devices (electrostatic capacitance detection devices) taken along the plane in which the Y and Z axes intersect each other. The operations of reading reflected light and reading transmitted light in the image reading devices (electrostatic capacitance detection devices) illustrated in FIGS. 13 and 14 are the same as those in the image reading device (electrostatic capacitance detection device) illustrated in FIGS. 9 to 12.

FIG. 13 illustrates an example in which the two image reading devices (electrostatic capacitance detection devices) both include the linear light sources 14 emitting light vertically to the reading object. FIG. 14 illustrates an example in which a linear light source 14 emitting light vertically to the reading object is provided behind the reading object in the space above the first surface 7 opposite to the second surface 8 of one image reading device (electrostatic capacitance detection device). Although the device housings in FIG. 14 accommodate the electrostatic capacitance detection devices and thus include components other than the linear light sources 14, another exemplary device housings not accommodating the electrostatic capacitance detection devices include only the components associated with the linear light sources 14.

The device housing, the image reading device, and the electrostatic capacitance detection device according to Embodiment 1 can achieve electrical connection with a small space while preventing deformation of a component made of an electrically conductive resin. This configuration does not require a special structure for achieving electrical connection and can therefore reduce the size of the component made of an electrically conductive resin. The image reading device and the electrostatic capacitance detection device according to Embodiment 1 are required to have a surface without protrusions or recesses because a reading object (detection object) is transported on the surface, and can achieve electrical connection with the ground conductor 3 by means that does not apply load on the electrically conductive component. The electrostatic capacitance detection device according to Embodiment 1 can readily maintain stable electrical connection, which is a requirement to reduce differences in performance in fabrication because the performance of the electrostatic capacitance detection device is directly affected by static electricity.

In the image reading device for detecting light, the components located between the reading object and the light receiver (sensor IC) need to be transparent. The surface of the image reading device is thus fabricated by integrating an electrically conductive resin and glass (frame body 1 and the dielectric plate 6). Although the integration of different materials tends to cause a level difference at the boundary between the materials due to differences in physical properties of the materials and may fail to satisfy the requirement for smoothness of the surface in the case of application of external load, the image reading device according to Embodiment 1 can readily solve this problem.

REFERENCE SIGNS LIST

1 Housing (frame body, first housing, cover)
2 Electrically conductive surface
3 Ground conductor
4 Ground auxiliary conductor (electrically conductive sheet)
5 Bent portion
6 Dielectric plate
7 First surface
8 Second surface
9 Second housing (frame)
10 Substrate
11 Elastic body
12 Optical component (lens array)
13 Light receiver (sensor element array)
14 Linear light source
15 First electrode
16 Second electrode
17 Oscillator circuit
18 Detection circuit
19 First substrate
20 Second substrate
101 Connector
102 Connecting cable
120 End
201 Connector
202 Signal processing circuit board (sensor substrate, light source control board)
203 Signal processing circuit
301 Connector
302 Connecting cable
303 Light source

The invention claimed is:

1. A device housing, comprising:
a dielectric plate having one surface and another surface, the one surface facing a space being a transport path, the another surface being opposite to the one surface;
a housing made of materials including at least an electrically conductive material, the housing being a frame body supporting the dielectric plate, and including an electrically conductive surface in at least part of a surface of the housing;
a ground conductor extending on the another surface of the dielectric plate being present on a plane different from a plane including the electrically conductive surface; and
a ground auxiliary conductor disposed over a level difference existing between the plane including the electrically conductive surface and the plane including the ground conductor, the ground auxiliary conductor being an electrically conductive sheet to connect the electrically conductive surface to the ground conductor electrically.

2. The device housing according to claim 1, wherein the electrically conductive surface is a surface of an electrically conductive filler exposed from the surface of the housing.

3. The device housing according to claim 1, wherein the ground auxiliary conductor is bent at an end of a portion connected to the electrically conductive surface electrically and is formed over the level difference.

4. The device housing according to claim 1, wherein the electrically conductive surface of the housing is located on a same side as the another surface of the dielectric plate.

5. The device housing according to claim 1, further comprising:
a second housing, wherein
the second housing has a box shape having an opening,
the housing is disposed to cover the opening, and
the housing and the second housing form an installation space therebetween.

6. The device housing according to claim 5, wherein the ground auxiliary conductor is disposed in the installation space.

7. The device housing according to claim 5, wherein the housing and the second housing each have a rectangular shape extending in longitudinal and transverse directions.

8. The device housing according to claim 7, wherein the electrically conductive surface of the housing is located along the transverse direction.

9. The device housing according to claim 7, wherein the ground conductor is an electrically conductive pattern provided on a substrate extending in the longitudinal direction.

10. An electrostatic capacitance detection device, comprising:
two of the device housings according to claim 9 facing each other;
a first electrode and a second electrode disposed in the installation space;
an oscillator circuit to generate an electric field between the first electrode and the second electrode;
a detection circuit to detect a variation in electrostatic capacity between the first electrode and the second electrode; and
a first substrate and a second substrate provided with at least one of the oscillator circuit or the detection circuit, wherein
the two substrates of the respective device housings correspond to the first substrate and the second substrate.

11. The electrostatic capacitance detection device according to claim 10, wherein each of the first electrode and the second electrode is disposed on a surface of the substrate facing the another surface of the dielectric plate.

12. The electrostatic capacitance detection device according to claim 10, wherein the ground conductor is disposed on a surface of the substrate opposite to a surface of the substrate facing the another surface of the dielectric plate.

13. The electrostatic capacitance detection device according to claim 10, wherein each of the first electrode and the second electrode is in contact with the dielectric plate.

14. The electrostatic capacitance detection device according to claim 10, further comprising:
an optical component disposed in the installation space and configured to converge light incident through the dielectric plate; and
a light receiver to receive the light converged by the optical component.

15. An image reading device, comprising:
the device housing according to claim 7;
an optical component disposed in the installation space and configured to converge light incident through the dielectric plate; and
a light receiver to receive the light converged by the optical component.

16. The image reading device according to claim 15, wherein
the optical component includes a lens array extending in the longitudinal direction, and
the light receiver includes a sensor element array having a plurality of sensor elements arranged in the longitudinal direction.

17. The image reading device according to claim 15, further comprising:
a linear light source extending in the longitudinal direction, the linear light source being accommodated in the installation space.

18. The device housing according to claim 7, further comprising:
an elastic body, wherein
the ground auxiliary conductor is pressed by the elastic body and thereby connected to the electrically conductive surface electrically.

19. An image reading device, comprising:
the device housing according to claim 18;
an optical component disposed in the installation space, the optical component including a lens array extending in the longitudinal direction and configured to converge light incident through the dielectric plate; and
a light receiver including a sensor element array having a plurality of sensor elements arranged in the longitudinal direction, the light receiver being configured to receive the light converged by the optical component, wherein
the elastic body is pressed by the lens array and thereby presses the ground auxiliary conductor.

20. The image reading device according to claim 19, wherein the lens array included in the optical component is in contact with the ground auxiliary conductor at an end in the longitudinal direction.

21. The image reading device according to claim 19, further comprising:
a linear light source extending in the longitudinal direction, the linear light source being accommodated in the installation space.

22. The device housing according to claim 1, further comprising:
an elastic body, wherein
the ground auxiliary conductor is pressed by the elastic body and thereby connected to the electrically conductive surface electrically.

* * * * *